United States Patent
Olsen

(10) Patent No.: US 10,586,757 B2
(45) Date of Patent: Mar. 10, 2020

(54) EXPOSED SOLDERABLE HEAT SPREADER FOR FLIPCHIP PACKAGES

(71) Applicant: LINEAR TECHNOLOGY CORPORATION, Milpitas, CA (US)

(72) Inventor: Edward William Olsen, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 15/167,345

(22) Filed: May 27, 2016

(65) Prior Publication Data

US 2017/0345744 A1   Nov. 30, 2017

(51) Int. Cl.
*H01L 23/495* (2006.01)
*H01L 23/31* (2006.01)
*H01L 23/00* (2006.01)

(52) U.S. Cl.
CPC .... *H01L 23/49568* (2013.01); *H01L 23/3142* (2013.01); *H01L 23/49503* (2013.01); *H01L 23/49541* (2013.01); *H01L 23/49548* (2013.01); *H01L 23/49582* (2013.01); *H01L 23/3107* (2013.01); *H01L 24/16* (2013.01); *H01L 24/32* (2013.01); *H01L 2224/16245* (2013.01); *H01L 2224/291* (2013.01); *H01L 2224/2919* (2013.01); *H01L 2224/32245* (2013.01); *H01L 2224/73253* (2013.01)

(58) Field of Classification Search
None
See application file for complete search history.

(56) References Cited

U.S. PATENT DOCUMENTS

| 5,111,278 A | 5/1992 | Eichelberger |
| 5,422,513 A | 6/1995 | Marcinkiewicz et al. |
| 5,497,033 A | 3/1996 | Fillion et al. |

(Continued)

FOREIGN PATENT DOCUMENTS

| FR | 2666687 A1 | 3/1992 |
| JP | 11-514149 A | 11/1999 |

(Continued)

OTHER PUBLICATIONS

USPTO. 2016. Non-final Office Action, dated Oct. 4, 2016, for U.S. Appl. No. 15/154,489, filed May 13, 2016, entitled "Laser Drilling Encapsulated Semiconductor Die to Expose Electrical Connection Therein," Edward William Olsen, inventor.

(Continued)

*Primary Examiner* — Matthew L Reames
*Assistant Examiner* — Steven B Gauthier
(74) *Attorney, Agent, or Firm* — Schwegman Lundberg & Woessner, P.A.

(57) ABSTRACT

A flipchip may include: a silicon die having a circuit side with solder bumps and a non-circuit side; a leadframe attached to the solder bumps on the circuit side of the silicon die; a heat spreader attached to the non-circuit side of the silicon die; and encapsulation material encapsulating the silicon die, a portion of the leadframe, and all but one exterior surface of the heat spreader. The leadframe may have NiPdAu plating on the portion that is not encapsulated by the encapsulation material and no plating on the portion that is attached to the solder bumps.

20 Claims, 5 Drawing Sheets

(56) References Cited

U.S. PATENT DOCUMENTS

| | | | |
|---|---|---|---|
| 5,565,706 | A | 10/1996 | Miura et al. |
| 5,703,400 | A | 12/1997 | Wojnarowski et al. |
| 5,745,984 | A | 5/1998 | Cole, Jr. et al. |
| 6,265,771 | B1 | 7/2001 | Ference et al. |
| 6,271,469 | B1 | 8/2001 | Ma et al. |
| 6,495,914 | B1 | 12/2002 | Sekine et al. |
| 8,482,118 | B2 | 7/2013 | Mohan et al. |
| 8,524,535 | B2 | 9/2013 | Sakamoto et al. |
| 9,431,319 | B2 | 8/2016 | Olsen et al. |
| 2004/0115862 | A1 | 6/2004 | Kung et al. |
| 2007/0035033 | A1 | 2/2007 | Ozguz et al. |
| 2007/0052070 | A1* | 3/2007 | Islam .............. H01L 21/561 257/666 |
| 2007/0290303 | A1* | 12/2007 | Lange ............. H01L 23/3107 257/669 |
| 2009/0115035 | A1 | 5/2009 | Bayan et al. |
| 2009/0263939 | A1 | 10/2009 | Sakamoto et al. |
| 2009/0283919 | A1 | 11/2009 | Tsui et al. |
| 2010/0124802 | A1 | 5/2010 | Chiang et al. |
| 2012/0025388 | A1 | 2/2012 | Law et al. |
| 2012/0162947 | A1 | 6/2012 | O'Donnell et al. |
| 2012/0193814 | A1 | 8/2012 | Dunne et al. |
| 2014/0001620 | A1* | 1/2014 | Shimizu ............ H01L 24/97 257/676 |
| 2015/0060940 | A1* | 3/2015 | Muto ............ H01L 23/49562 257/140 |
| 2016/0035644 | A1 | 2/2016 | Olsen et al. |
| 2016/0035645 | A1 | 2/2016 | Olsen et al. |

FOREIGN PATENT DOCUMENTS

| | | |
|---|---|---|
| JP | 2008-042063 A | 2/2008 |
| KR | 10-2012-0071360 A | 7/2012 |
| WO | WO1997002600 A1 | 1/1997 |

OTHER PUBLICATIONS

USPTO. 2015. Non-final Office Action, dated Oct. 20, 2015, for U.S. Appl. No. 14/630,302, filed Feb. 24, 2015, entitled "Exposed, Solderable Heat Spreader for Flipchip Packages," Edward William Olsen et al., inventors.
USPTO. 2015. Non-final Office Action, dated Oct. 20, 2015, for U.S. Appl. No. 14/630,239, entitled "Exposed Solderable Heat Spreader for Integrated Circuit Packages."
EPO. 2016. Extended European Search Report, dated Jan. 4, 2016, for EP 15002262.2, entitled "Exposed Solderable Heat Spreader for Integrated Circuit Packages."
USPTO. 2016. Final Office Action, dated Mar. 30, 2016, for U.S. Appl. No. 14/630,239, entitled "Exposed Solderable Heat Spreader for Integrated Circuit Packages."
Korean Intellectual Property Office. 2016. Notice of Reason for Rejection for Korean Application No. 10-2015-0106264, entitled "Exposed Solderable Heat Spreader for Integrated Flip Chips."
USPTO. 2016. Notice of Allowance for U.S. Appl. No. 14/630,239, entitled "Exposed Solderable Heat Spreader for Integrated Circuit Packages."
Taiwanese Office Action dated Nov. 29, 2016, which issued in Taiwanese Application No. 104124088, and English language translation thereof.

\* cited by examiner

EXPOSED SOLDERABLE HEAT SPREADER FOR FLIPCHIP PACKAGES

BACKGROUND

Technical Field

This disclosure relates to integrated circuit packaging, including flipchip and other types of packages that are configured to be mounted to a printed circuit board.

Description of Related Art

Quad flat no-lead (QFN) packages may include a flipchip on leads where the die backside is exposed (Carsem). However, the heat that these generate can be problematic. Assembly subcontractors offer flipchip on lead for leaded packages, e.g., the TSOT made by Carsem and the UTAC and the SC70 made by UTAC. Again, however, the heat generated by these can be problematic.

Proposals have been made for using heat sinks to address the heating problem. See, e.g., U.S. PGPub 2009/0115035 and U.S. PgPub 2007/02900303. However, these devices can be damaged during surface mounting by a customer.

Attempts to mount a heat spreader to the backside of a die may also have suffered from one or more of the following problems:

They may provide only limited thermal dissipation to the customer's board.

QFNs with exposed die backsides may require an external heat spreader to be mounted to the top of the part, adding significant cost for the customer.

Leaded packages with internal flipchip on leads that do not have exposed die backs or heat spreaders may be limited to thermal dissipation through side leads.

Exposed die packages may have a solderable finish on the die backside to be soldered to the board. The area of thermal dissipation may be limited by the die size.

CTE mismatch between the leadframe and heatsink to the die silicon during reflow may be large enough to cause delamination between the die and the heatsink and between the mold compound and leadframe, thus removing the thermal and electrical path and increasing stress to the flipchip solder joints.

SUMMARY

A flipchip may include: a silicon die having a circuit side with solder bumps and a non-circuit side; a leadframe attached to the solder bumps on the circuit side of the silicon die; a heat spreader attached to the non-circuit side of the silicon die; and encapsulation material encapsulating the silicon die, a portion of the leadframe, and all but one exterior surface of the heat spreader. The leadframe may have NiPdAu plating on the portion that is not encapsulated by the encapsulation material and no plating on the portion that is attached to the solder bumps.

The heat spreader may have a surface that is attached to the non-circuit side of the silicon die and that has a roughness between 0.3 to 0.5 microns.

The exterior surface of the heat spreader and the portion of the leadframe that is not encapsulated by the encapsulating material may be plated with the same type of plating material.

The leadframe may have leads to which the bumps are connected that have no straight length portion greater than 1 mm.

The heat spreader may include a plurality of thermally-conductive sections that are separated by separating material having a coefficient of thermal expansion (CTE) that is between the CTE of the silicon die and the CTE of the thermally-conductive sections. The separating material may be pliable.

The heat spreader may include a plurality of thermally-conductive sections that are separated by separating material that is pliable.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Figure 1:
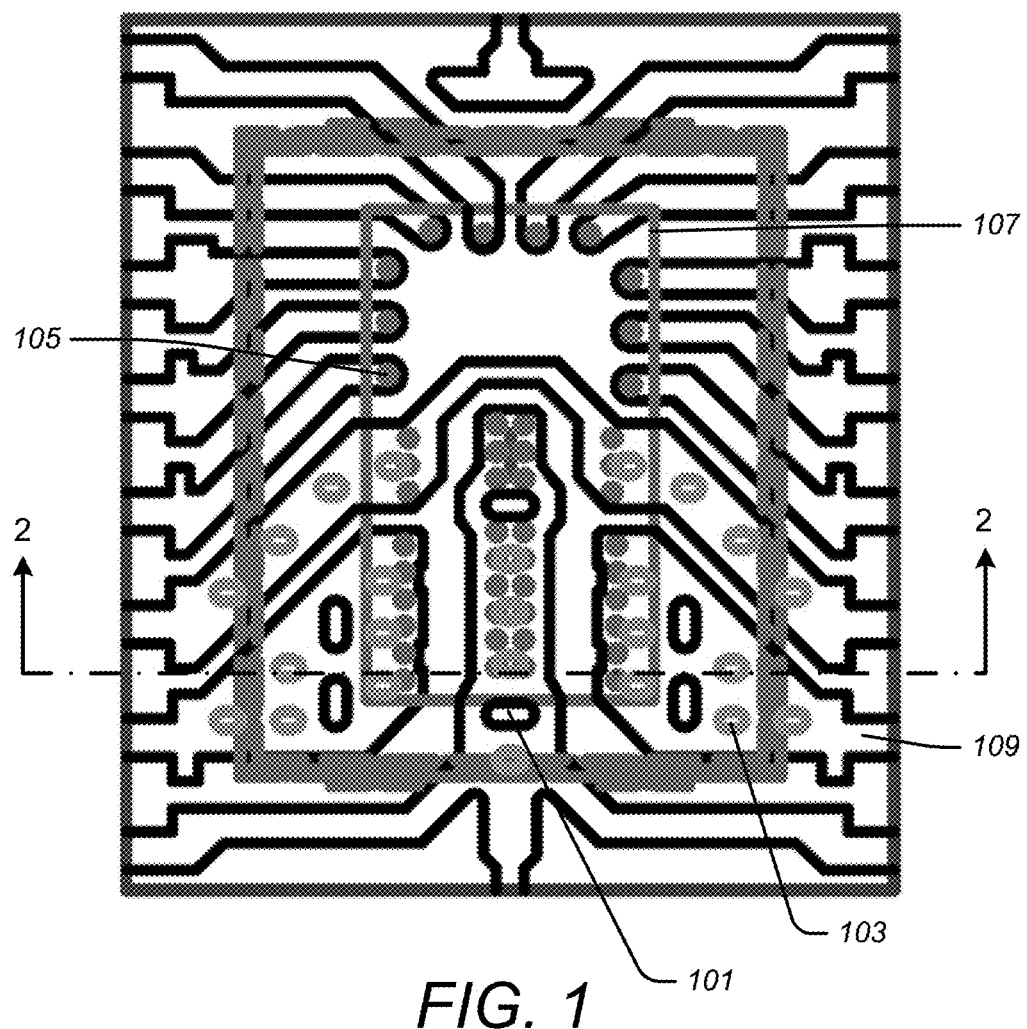
FIG. 1 illustrates an example of a leadframe with a flipchip die facing up underneath.

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

This disclosure will now describe a construction of a leaded package with an exposed heat spreader that is connected internally to a backside of a die that is attached to a leadframe on the front side. Modifications to this alternative construction have led to a package that may meet the Jedec Moisture Sensitivity Level 1 rating and survive temperature cycling that may be critical for the package performing thermally and electrically as intended. Modifications to this are also described below.

A flipchip on lead assembly may be made by placing a bumped die face down onto a leadframe and reflow solder to create a solder joint to complete the connections. The leadframe with die attached may then be molded and the units singulated from the leadframe. For non-exposed die packages, the height of the die and bumps from the surface of the leadframe may be less than the mold cavity that encases them. To expose the die, the total height of the die and bumps may be adjusted to be the same or slightly greater than the mold cap so that the die is pressed against the mold cavity surface during molding.

A heat spreader may be added to the back of the flipchip die to a total height that allows it to be exposed after molding. The height can be adjusted using the die bumps, die thickness, or heat spreader thickness. The entire assembly may lie within the mold cavity, and the mold compound that is directly over the heat sink may be removed later to expose it. Alternatively, the heat sink may be pressed into a mold cavity surface so that it is left exposed after molding.

The attachment of the heat spreader to the backside of the die can be completed using different methods. These may include:

- Bumped die may be placed onto the heatsinks using epoxy or solder for attachment. The die and heatsink assembly may be placed onto the leadframe together.
- The die may be attached to the leadframe first, and the heatsink may be attached to the back side of the die secondly. Again, epoxy or solder can be used for the attachment.

These enhancements may enable this package to survive Jedec MSL 1 and temperature cycling conditions (−655 C to 150 C) and may result in or facilitate one or more of the following:

- An increase in the leadframe and heat sink surface roughness to approximately 0.3-0.5 um Ra.
- Establishing maximum straight lengths of copper with which the flipchip die is attached to, based upon thickness of the leadframe and mold compound used. For example, maximum straight length for 8 mil thick leadframe could be 1 mm.
- Addition of notches, holes and/or mold compound locking features to the leads which the flipchip die rests on.
- Addition of half etched edges to the heatsink for additional locking of the mold compound.
- Utilizing multiple sections of thermally conductive material which are connected together with a low CTE, low modulus material.

Although flipchip on lead has been described as the assembly method, any other method of attaching the leadframe fingers to the die I/O's can be used. For example:

- Plated bond pads placed onto solder paste on the leads, or vice versa.
- Die connected to multilayer substrate which is then connected to the leads.
- Pillar bumped die with solder caps dipped in flux, or flux applied to the leads.
- Solder bumped die placed directly onto leads or onto paste on the leads.

Alternative ways to add a heatsink to the backside of the die may include:

- Mold package with exposed die. Attach heatsink after molding.
- Sputter and plate exposed pad to and exposed die and the bottom of package after mold.

What has been described may allow the backside of an internal flipchip die to be directly connected to a heat spreader which can be directly attached to the customer's board. The heat spreader can be made larger than the die to increase the area of thermal dissipation.

These enhancements to the leadframe and heatsink may improve the adhesion of the mold compound and die attach adhesive to them so that they can survive multiple reflows, even after storage in ambient conditions for greater than a year.

FIG. 1 illustrates an example of a leadframe 109 with a flipchip die 107 face up underneath. The die may be connected to the lead frame with solder bumps, such as a solder bump 105. There may be stress relief locking holes, such as a stress relief locking hole 101, within the lead frame to keep the maximum straight length of metal to the bumps less than 1 mm. There may be additional half-etched dimples, such as a half-etched dimple 103, to additionally break up the plane.

Figure 2:
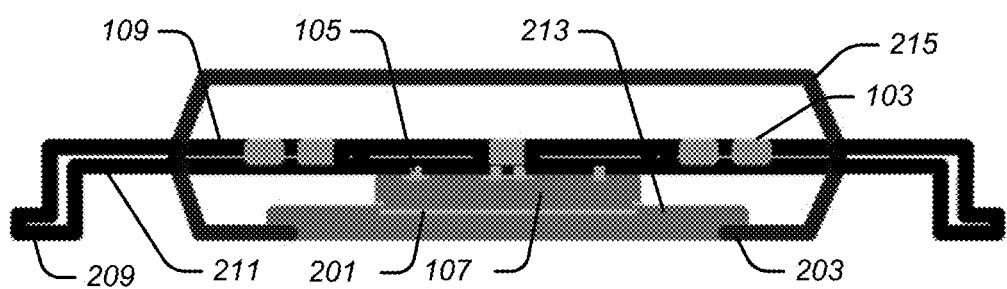
FIG. 2 illustrates a cross-sectional view of the leadframe illustrated in FIG. 1 taken along the line 2-2 in FIG. 1.

FIG. 2 illustrates a cross-sectional view of the leadframe illustrated in FIG. 1 taken along the line 2-2 in FIG. 1. The lead frame 109, die 107, and heat spreader 213 may be encapsulated with mold compound 215. Half etched locking features, such as a half-etched locking notch 203, may be around the heat spreader which may be connected to the die. Locking features may include half-etched dimples in the leadframe, or holes entirely etched through the leadframe, half-etched steps along and underneath the outer edges of the heat spreader.

Figure 3:
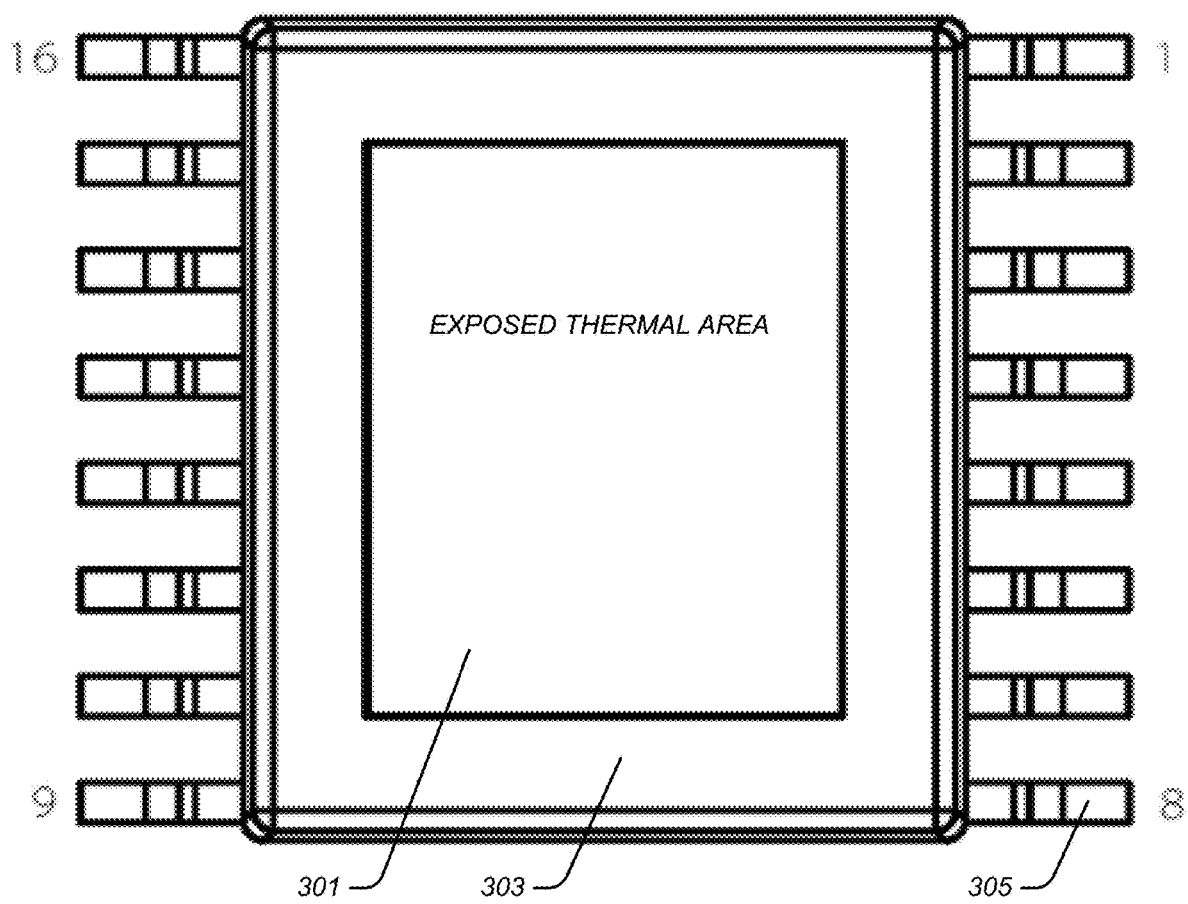
FIG. 3 illustrates an example of a bottom side of a flipchip package with an exposed heat spreader.

FIG. 3 illustrates an example of a bottom side of a flipchip package with an exposed heat spreader 301. A molded encapsulant 303 may cover and protect an internal lead frame and flipchip die. The flipchip package may have external leads 305, which may have the same plating finish as the exposed portion of the heat spreader, 301.

Figure 4:
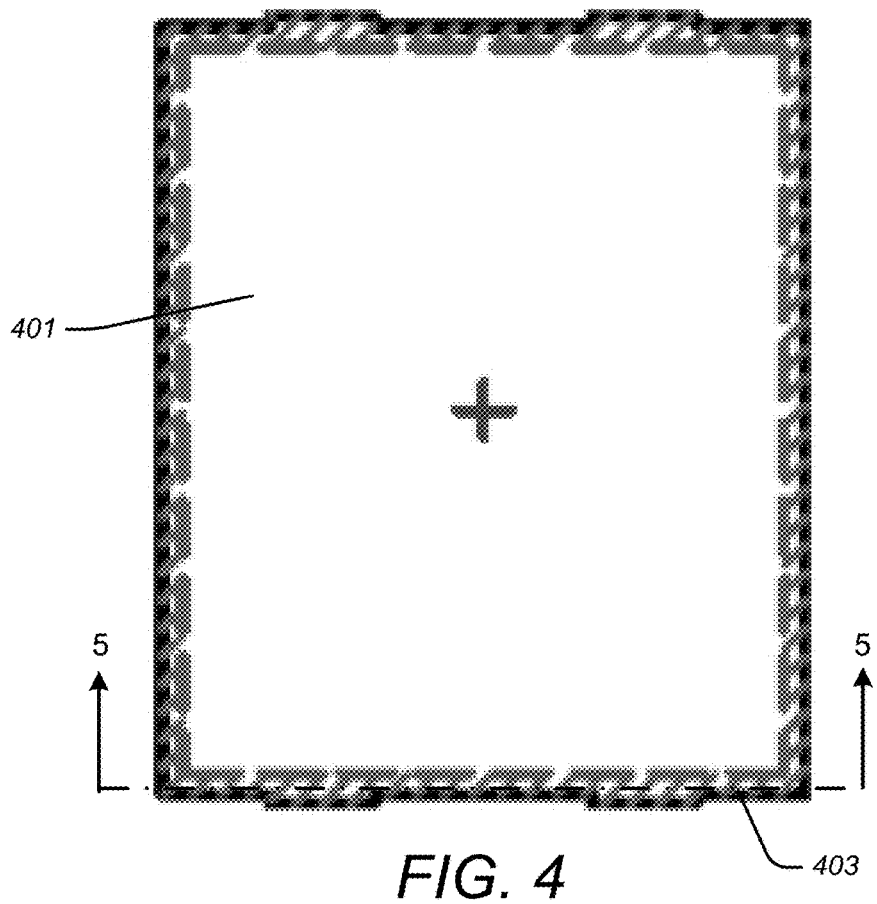
FIG. 4 illustrates an example of a heat spreader with half-etched locking features around its edges.

FIG. 4 illustrates an example of a heat spreader 401 with half-etched locking features around its edges, such as the half-etched locking feature 403. The bottom portion of the heat spreader along the perimeter may be half-etched such that the encapsulating material flows underneath to better lock the encapsulating material to the heat spreader.

Figure 5:
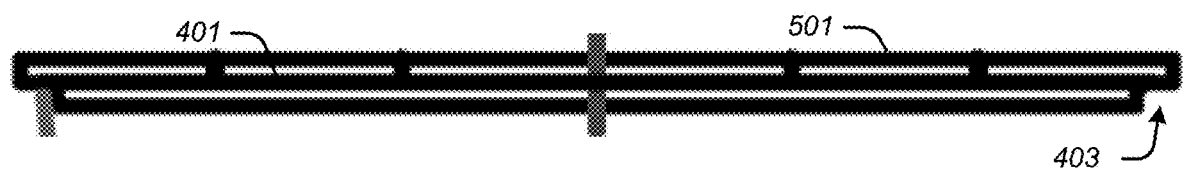
FIG. 5 illustrates a cross-sectional view of the heat spreader illustrated in FIG. 4 taken along the line 5-5.

FIG. 5 illustrates a cross sectional view of the heat spreader 401 illustrated in FIG. 4 taken along the line 5-5 with half-etched locking features, such as the half-etched locking feature, around its edges. The heat spreader may have an internal surface 501 that may have increased roughness, which may be anywhere in the range of 0.3 um-0.5 um Ra or outside of this range.

Figure 6:
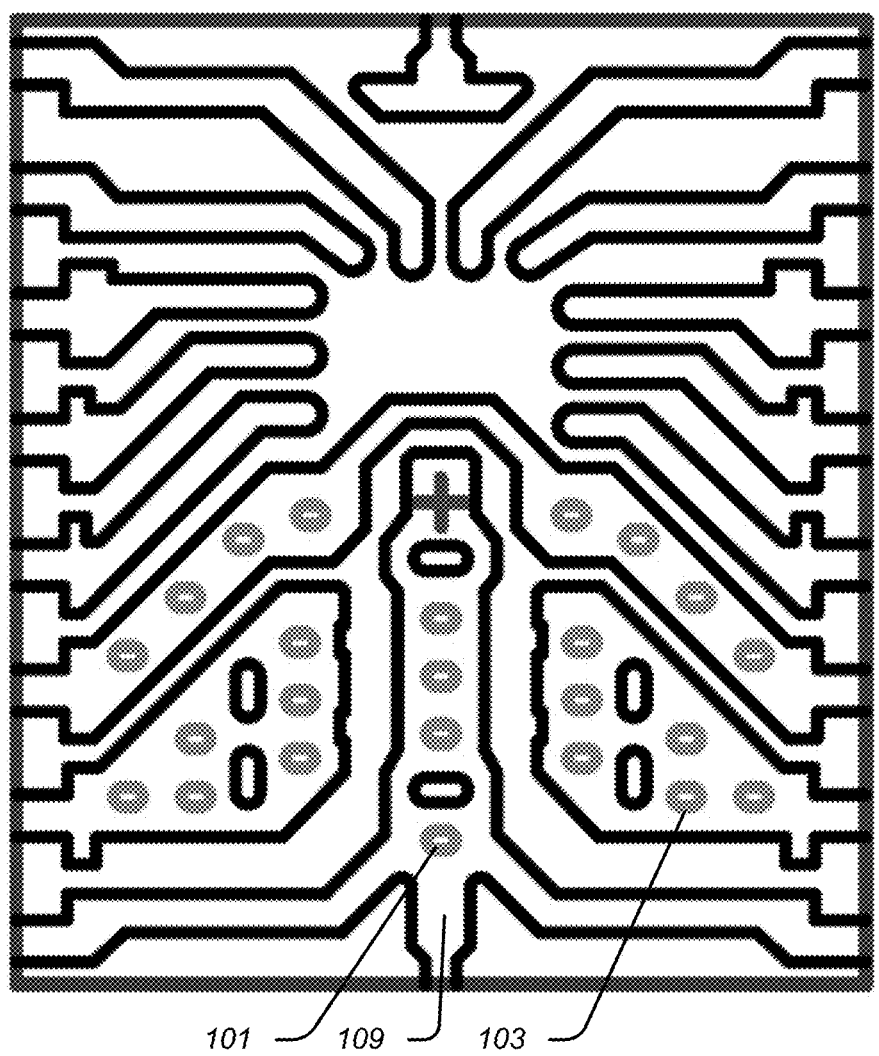
FIG. 6 illustrates an example of an internal design of a lead frame without the die and heat spreader omitted.

FIG. 6 illustrates an example of the internal design of the leadframe 109, with stress relieving locking holes, such as the stress-relieving locking hole 101, and half etched stress relief dimples, such as the half-etched stress relief dimple 103.

Figure 7:
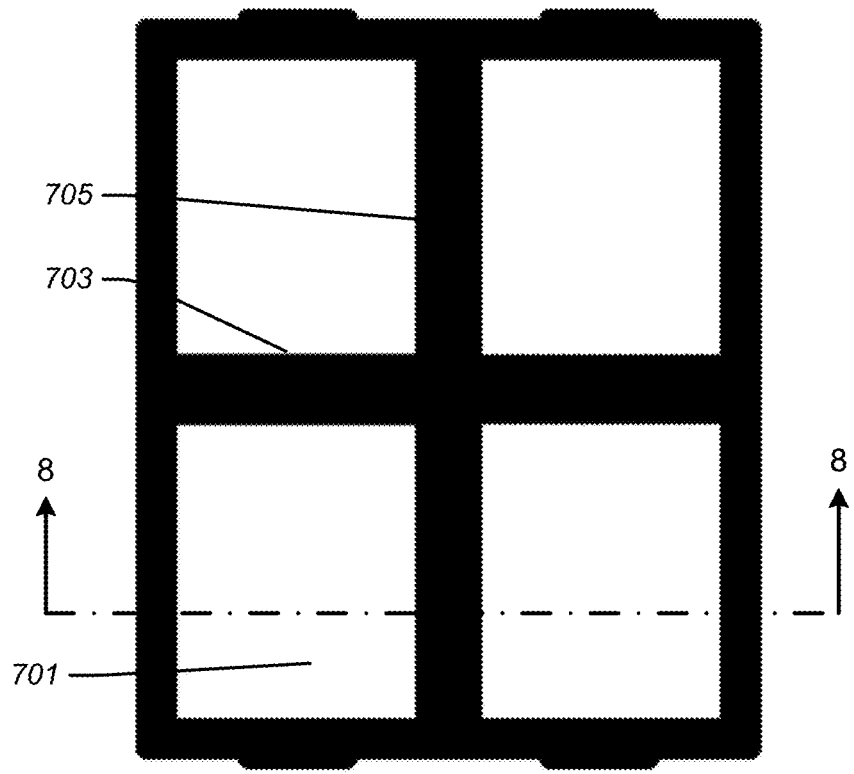
FIG. 7 illustrates an example of a low stress heat spreader where the thermally conductive sections are connected with a low coefficient of thermal expansion (CTE), low modulus material.

FIG. 7 illustrates an example of a low stress heat spreader that may have multiple, thermally-conductive sections, such as the section 701, that may be connected to one another with a low coefficient of thermal expansion (CTE), low modulus material, such as the material 703.

Figure 8:
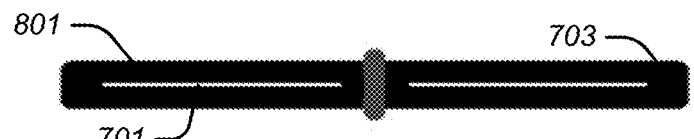
FIG. 8 illustrates a cross sectional view of the heat spreader illustrated in FIG. 7 taken along the line 8-8.

FIG. 8 illustrates a cross sectional view of the heat spreader illustrated in FIG. 7 taken along the line 8-8, with multiple thermally conductive sections, such as the thermally conductive section 701, connected together with a low coefficient of thermal expansion (CTE), low modulus material, such as the material 703, in which the internal surface of the heat spreader, such as the internal surface 801, is rough, such as within the range 0.3 um-0.5 um Ra.

Other details about flipchip packages and approaches for adding exposed solderable heat spreaders to them are described in U.S. patent application Ser. No. 14/630,302, entitled "Exposed, Solderable Heat Spreader for Flipchip Packages," filed Feb. 24, 2015, the entire content of which is incorporated herein by reference.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, the shapes, sizes, thickness, number, and orientation of the heat spreader, including its sections when made in sections, could be different.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A flipchip comprising:
   a silicon die having a circuit side with solder bumps and a non-circuit side;
   a leadframe attached to the solder bumps on the circuit side of the silicon die;
   a heat spreader attached to the non-circuit side of the silicon die; and
   encapsulation material encapsulating the silicon die, a portion of the leadframe, and all but one exterior surface of the heat spreader,
   wherein the leadframe has leads that are longer than 1 mm to which the solder bumps are connected, but that have no straight length portion greater than 1 mm.

2. The flipchip of claim 1 wherein the exterior surface of the heat spreader and the portion of the leadframe that is not encapsulated by the encapsulation material are plated with NiPdAu plating.

3. The flipchip of claim 1 wherein the heat spreader includes a plurality of thermally-conductive sections that are separated by separating material having a coefficient of thermal expansion (CTE) that is between the CTE of the silicon die and the CTE of the thermally-conductive sections.

4. The flipchip of claim 3 wherein the separating material is pliable.

5. The flipchip of claim 1 wherein the heat spreader includes a plurality of thermally-conductive sections that are separated by separating material that is pliable.

6. A flipchip comprising:
   a silicon die having a circuit side with solder bumps and a non-circuit side;
   a leadframe attached to the solder bumps on the circuit side of the silicon die, wherein the leadframe comprises leads that are at longer than 1 mm and at least one feature that limits a maximum straight length of the leads to 1 mm;
   a heat spreader attached to the non-circuit side of the silicon die;
   encapsulation material encapsulating the silicon die, a portion of the leadframe, and all but one exterior surface of the heat spreader.

7. The flipchip of claim 6, wherein the one exterior surface of the heat spreader and an additional portion of the leadframe that is not encapsulated by the encapsulation material are plated with a common plating material.

8. The flipchip of claim 7, wherein the common plating material is NiPdAu.

9. The flipchip of claim 6, wherein the at least one feature comprises at least one stress relief locking hole in the leadframe.

10. The flipchip of claim 9, wherein the at least one feature further comprises at least one half-etched dimple on the leadframe.

11. The flipchip of claim 6, wherein the at least one feature comprises at least one stress relief locking hole in the leadframe and a plurality of half-etched dimples on the leadframe.

12. A device, comprising:
a circuit die;
a leadframe having a first side that is attached by a plurality of solder bumps to a first side of the circuit die;
a heat spreader attached to an opposing second side of the circuit die; and
at least one surface feature on an opposing second side of the leadframe, the at least one surface feature comprising an opening that extends from the opposing second side of the leadframe at least partially into the leadframe toward the first side of the leadframe, the at least one surface feature configured to limit a straight length of a region between solder bumps or an edge of the leadframe below a length of 1 mm, wherein the total length of the region between solder bumps or an edge of the leadframe is longer than 1 mm.

13. The device of claim 12, wherein the at least one surface feature comprises a stress relief locking hole that extends from the opposing second side through to the first side of the leadframe.

14. The device of claim 13, wherein the at least one surface feature comprises a half-etched dimple that extends from the opposing second side partially through the leadframe toward the first side of the leadframe.

15. The device of claim 12, wherein the at least one surface feature comprises a plurality of half-etched dimples that each extend from the opposing second side partially through the leadframe toward the first side of the leadframe.

16. The device of claim 12, wherein the at least one surface feature limits a maximum straight length of all leads on the leadframe.

17. The device of claim 12, further comprising a common coating on exposed portions of leads of the leadframe and on an external surface of the heat spreader.

18. The device of claim 17, wherein the common coating comprises NiPdAu.

19. The device of claim 12 wherein the heat spreader includes a plurality of thermally-conductive sections that are separated by a separating material having a coefficient of thermal expansion (CTE) that is between the CTE of the circuit die and a CTE of the thermally-conductive sections.

20. The device of claim 19, wherein the separating material is pliable.

* * * * *